United States Patent [19]

Itemadani et al.

[11] Patent Number: 4,825,536
[45] Date of Patent: May 2, 1989

[54] METHOD FOR FABRICATING ELECTRONIC CIRCUIT BOARD

[75] Inventors: Eiji Itemadani, Sakai; Shuichi Murakami, Hirakata; Kazuhiro Mori, Katano, all of Japan

[73] Assignee: Matsushita Electric Industrial Co., Ltd., Kadoma, Japan

[21] Appl. No.: 103,868

[22] Filed: Oct. 2, 1987

[30] Foreign Application Priority Data

Oct. 6, 1986 [JP] Japan ................................ 61-237349

[51] Int. Cl.⁴ ...................... H01C 17/06; H05K 13/04
[52] U.S. Cl. .......................................... 29/620; 29/593; 29/836; 29/740
[58] Field of Search ...................... 29/593, 610 R, 620, 29/825, 832, 836, 840, 701, 740, 709

[56] References Cited

U.S. PATENT DOCUMENTS 4,307,832 12/1981 Taki et al. ............................ 228/5.1
4,646,057 2/1987 Reynolds ........................... 29/620 X
4,694,568 9/1987 Morelli et al. ........................ 29/620

Primary Examiner—Howard N. Goldberg
Assistant Examiner—Taylor J. Ross
Attorney, Agent, or Firm—Cushman, Darby & Cushman

[57] ABSTRACT

Fabrication of an electronic circuit board is carried out by forming a predetermined number of resistors having various resistances based on a circuit design stored in a memory on a nonconductive substrate and dividing the nonconductive substrate into discrete resistors, then mounting the discrete resistors on a circuit board and testing operation characteristic thereof; and when some resistors having resistances which are not suitable to obtain a predetermined operation characteristic exist in the above-formed resistors, the resistances are corrected, and electronic circuit board having corrected accurate electric constants is obtained; and thereby a complete electronic circuit boards are fabricated by repetition of above-mentioned respective steps.

4 Claims, 6 Drawing Sheets

METHOD FOR FABRICATING ELECTRONIC CIRCUIT BOARD

FIELD OF THE INVENTION AND RELATED ART STATEMENT

1. FIELD OF THE INVENTION

The present invention relates generally to a method for fabricating an electronic circuit board, and more particularly to a method for fabricating an electronic circuit board including a plurality of resistors and capacitors.

2. DESCRIPTION OF THE RELATED ART

In a conventional method for fabricating an electronic circuit board, standard electronic parts such as resistors, capacitors and the like are mounted on a circuit board which is designed under a predetermined specification. Namely, the circuit board for mounting the electronic parts is affixed on an automatic electronic parts mounting apparatus, and a plurality of cartridges containing many standard electronic parts are also set to the electronic parts mounting apparatus. A mounting head of the electronic parts mounting apparatus selects the electronic parts in a predetermined order based on data of circuit design previously designed and mounts the selected electronic parts on a predetermined position of the circuit board. In the conventional method, the circuit board is designed so as to be suitable for the standard electronic parts.

However, the conventional use of the standard electronic parts is thrust at the problem of restriction in design of the circuit board resulting from the size and characteristics of the standard electronic parts. Namely, in case that the most suitable standard parts is unable to obtain, a variable resistor is used to realize necessary desired circuit characteristics. Furthermore, a long work time has been required from design of the circuit board to fabrication of the electronic circuit board, as a result of a long delivery time of the standard electronic parts, for example.

OBJECT AND SUMMARY OF THE INVENTION

An object of the present invention is to provide a method for fabricating an electronic circuit board having high applicability in circuit design by making electronic parts having the most suitable electric constant value for the circuit design.

Another object of the present invention is to shorten period which is required from circuit design to fabrication of the electronic circuit board.

The method for fabricating electronic circuit board in accordance with the present invention comprises the steps of storing circuit data including electric constant values of electronic parts and special arrangement of the electronic parts in an electronic circuit board in a memory, in accordance with a predetermined circuit design, making an electronic parts integrated plate having a plurality of electronic parts arranged in a predetermined order in accordance with the stored circuit data in the memory on a substrate, dividing the electronic parts integrated plate into discrete electronic parts, and mounting the discrete electronic parts on the electronic circuit board on the basis of the stored circuit data.

DESCRIPTION OF THE PREFERRED EMBODIMENTS

Figure 7:
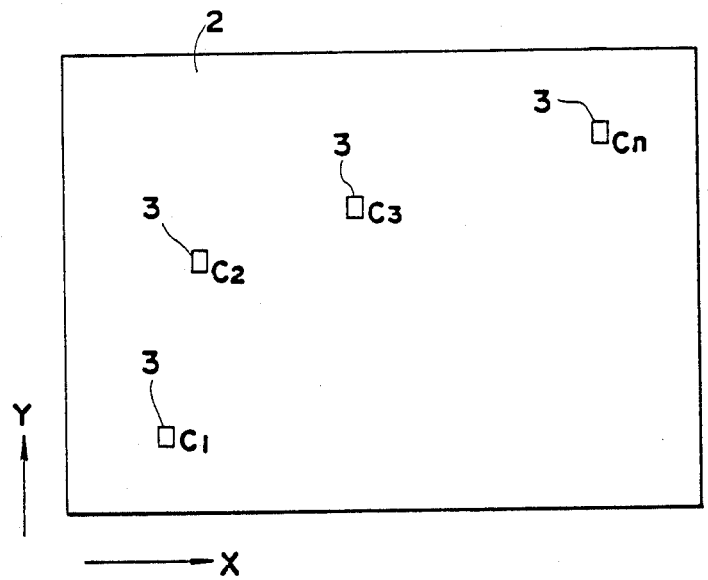
FIG. 7 is a plan view of an example of an electronic circuit board whereon the resistors are mounted.

In designing an electronic circuit board in accordance with an embodiment of the the present invention, a plurality of resistors and capacitors as electronic parts having various resistances and capacitances necessary in accordance with the circuit design are selected, and positions thereof to be mounted on the electronic circuit board are designed on the basis of a predetermined technical specification. Then data showing the resistances, capacitances and positions of the respective resistors and capacitors are stored in memory means in a computer aided designing system as circuit data having addresses. An example of the above-mentioned electronic circuit board is shown in FIG. 7. Referring to FIG. 7, electronic parts 3 such as resistors are mounted on a circuit board 2, and their positions shown by X-Y coordinates are designated by addresses of $C_1, C_2, \ldots C_n$.

Figure 1:
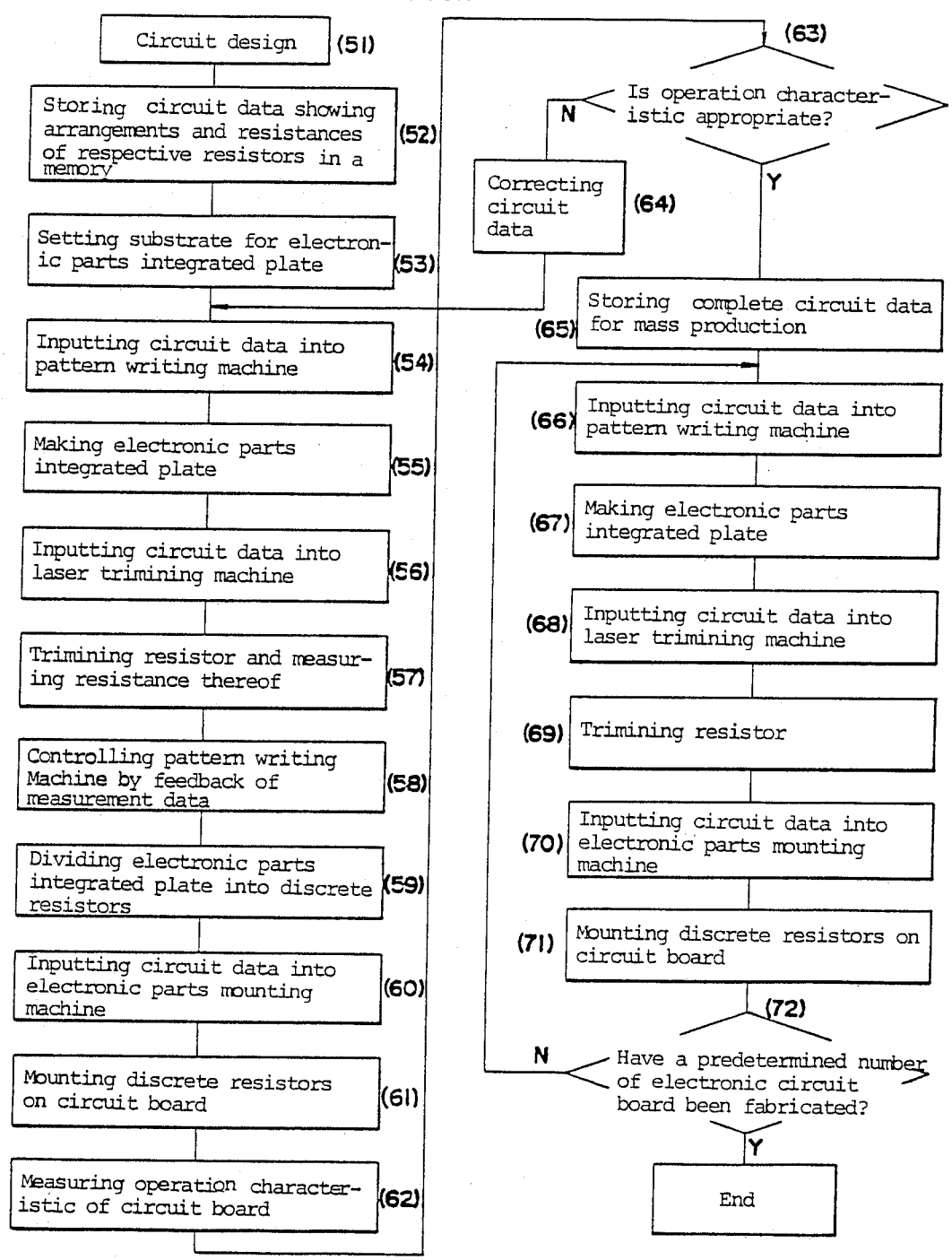
FIG. 1 is a flow chart showing an embodiment of a method for fabricating electronic circuit board in accordance with the present invention.
Figure 2:
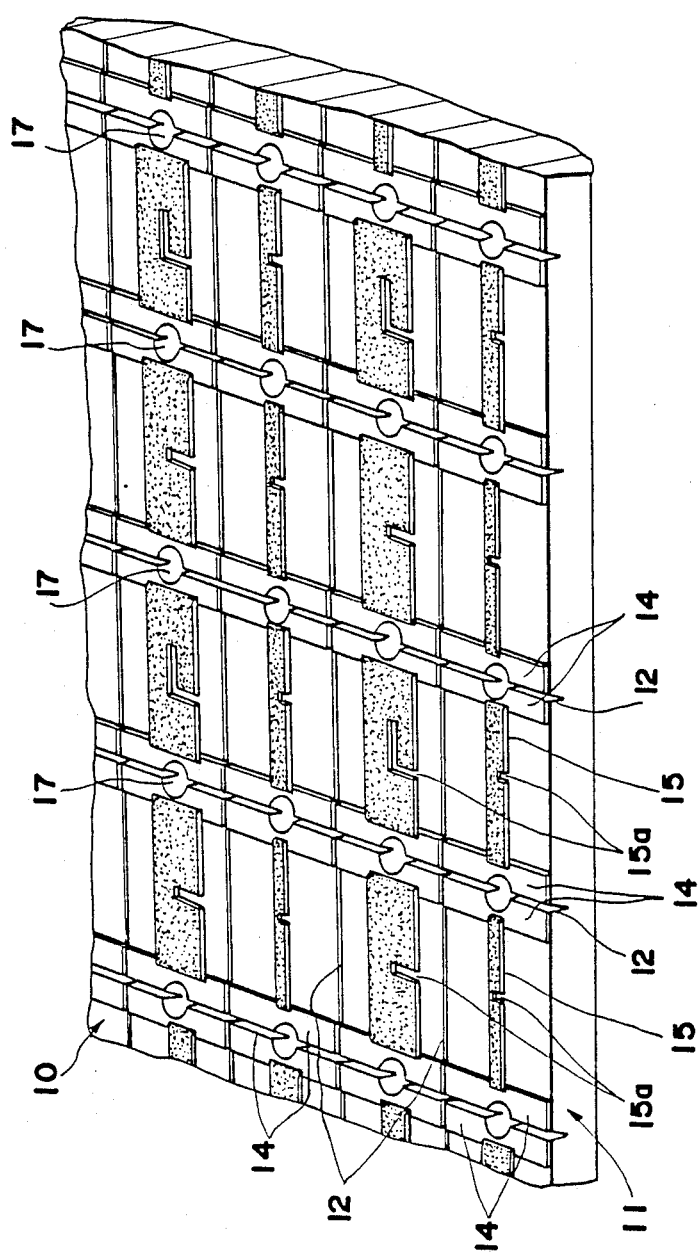
FIG. 2 is a perspective view of an electronic parts integrated plate in the present invention.
Figure 3:
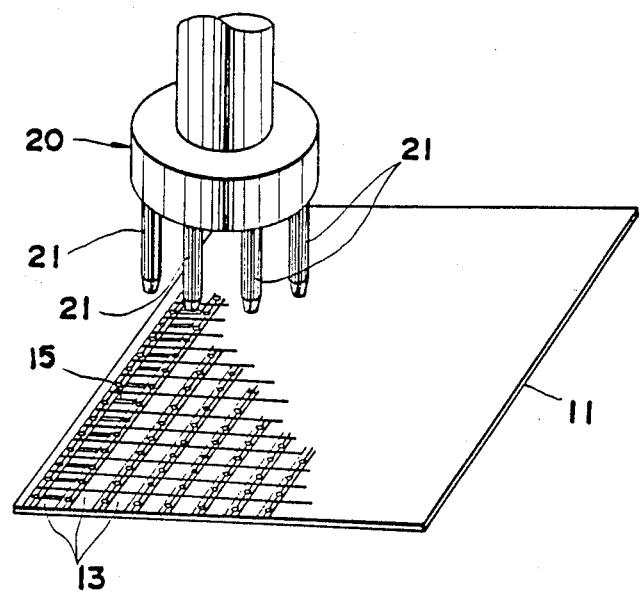
FIG. 3 is a perspective view of a coating head and the electronic parts integrated plate made thereby in the embodiment.
Figure 4:
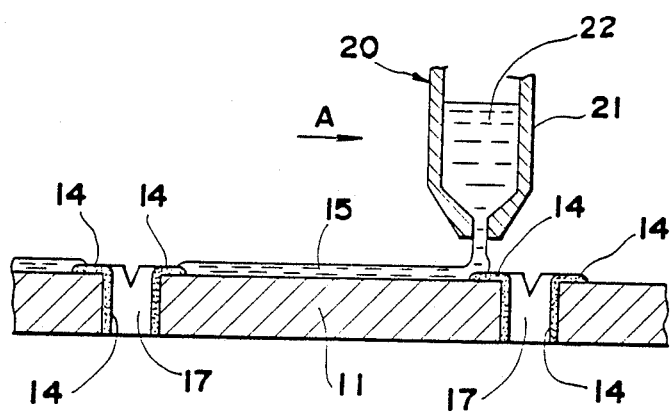
FIG. 4 is a side sectional view showing a coating process in the embodiment.
Figure 6:
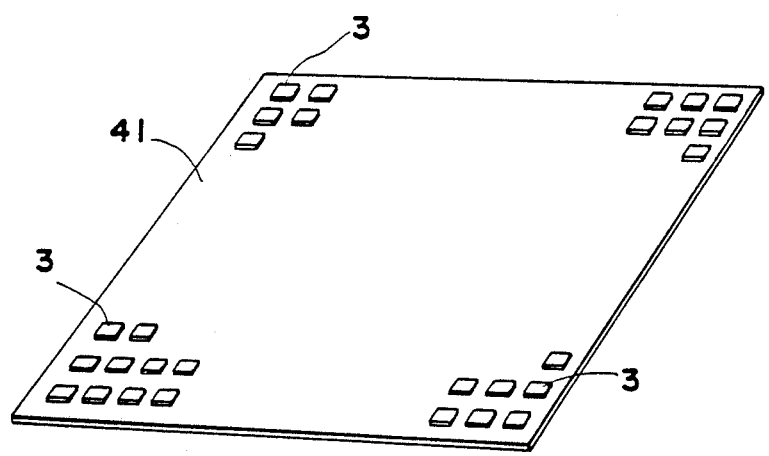
FIG. 6 is a perspective view showing integrated resistors affixed to an expanding sheet.

A method for fabricating the electronic circuit board in accordance with the present invention is shown by a flow chart of FIG. 1. In the method, instead of conventional using of standard electronic parts, necessary electronic parts are made on an electronic parts integrated plate 10. An example of the electronic parts integrated plate 10 is shown in FIG. 2. A process for making the electronic parts integrated plate 10 are shown in FIG. 3, FIG. 4 and FIG. 6. Referring to FIG. 2, the electronic parts in the example is only the resistor.

On a substrate 11 which is made of alumina ceramics, vertical and horizontal V-shaped grooves 12 are made with a predetermined intervals on its surface. Holes 17 are made on the respective vertical grooves 12 at central portions between the neighboring horizontal grooves 12. Lead layers 14 formed by electronic conductive material are provided on both banks of the respective vertical grooves 12. The layer of the electric conductive material is also formed on an inner wall of the hole 17, and the lead layer 14 is joined with the layer of the inner wall of the hole 17. A resistor element 15 is formed on the substrate 11 connecting two lead layers 14 of the neighboring grooves 12.

A process for forming the resistor element 15 is shown in FIG. 4. Referring to FIG. 4, a coating nozzle 21 of a pattern writing machine 20 is moved over the substrate 11 as shown by an arrow A, and an electric conductive paste 22 having a predetermined resistivity is supplied on the substrate 11. The pattern writing machine 20 has a plurality of the coating nozzles 21 as shown in FIG. 3, and the respective coating nozzles 21 contain various kinds of electric conductive paste 22 which are varied in resistivity. Areas and shapes of the openings of the respective coating nozzles 21 are made different from each other so that the resistors of resistances from 100 ohm to 1 megaohm are formed on the substrate 11 by selection of the coating nozzles 21 and of coating width and thickness.

The substrate 11 is affixed under the pattern writing machine 20 and is sifted, corresponding to the circuit data of the computer aided designing system, thereby the respective resistor elements 15 of desired values are formed in the order of addresses $C_1, C_2, \ldots C_n$. The substrate 11 coated with the electric conductive paste 22 is dried and baked in a baking furnace. The above-mentioned process is shown by steps (51), (52), (53), (54) and (55) in FIG. 1.

Subsequently, the substrate 11 is introduced in a conventional laser trimming process. The respective resistor elements 15 on the substrate are measured and trimmed on the basis of the circuit data of the computer aided designing system. Thereby the resistances of the respective resistor elements 15 are adjusted so as to meet the designed circuit data. Trimming marks 15a of the resistor elements 15 are shown in FIG. 2. Then, measurement data is formed on the basis of a difference between the resistance measured in advance of trimming and the resistance corresponding to the circuit data. The measurement data is fed back to the pattern writing machine 20, whose operation is adjusted on the basis of the measurement data. As a result, when a next electronic parts integrated plate 10 is made, thickness or width of the resistor element 15 is varied by controlling or changing the coating nozzle 21. Consequently, resistances of the resistor elements 15 can be made accurate of very close to the circuit data, and the subsequent trimming process is simplified (Steps 56, 57 and 58). The electronic parts integrated plate 10 is acheived by the above-mentioned process.

Figure 5:
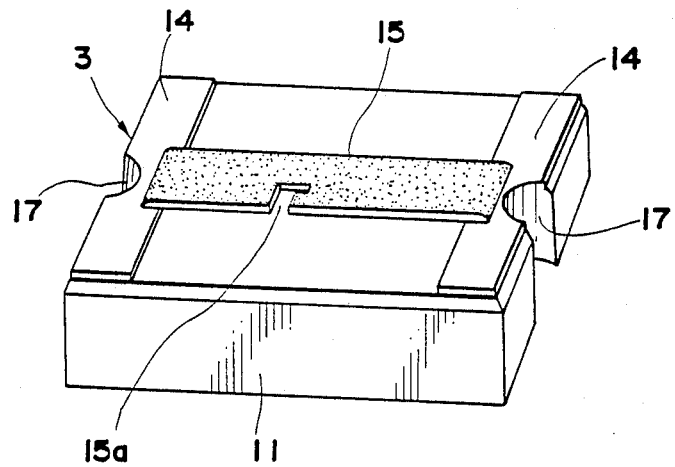
FIG. 5 is a perspective view of a discrete resistor in the embodiment.

Subsequently, the substrate 11 is affixed onto an expanding sheet 41 made of elastic resin or rubber, and is divided into discrete resistors 3 along the vertical and horizontal grooves 12 (Step 59). Then the expanding sheet 41 is expanded as shown in FIG. 6, so that arrangement of the discrete resistors 3 on the expanding sheet 41 becomes to have predetermined intervals therebetween. One pice of the resultant discrete resistor 3 is shown in FIG. 5 on an enlarged scale.

Figure 9:
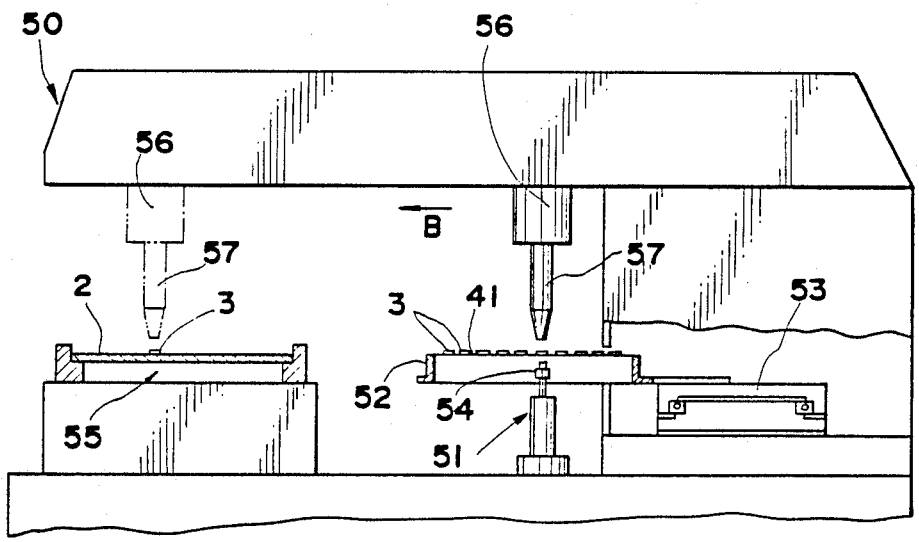
FIG. 9 is a side view of an example of an electronic parts mounting apparatus for embodying the method of the present invention.

The expanded sheet 41 having the discrete resistors 3 is set on a supplying station 51 of a parts mounting machine 50 as shown in FIG. 9. The expanded sheet 41 is held by a holding frame 52, which is shifted by an X-Y table 53. A lifting pin 54 is provided under the expanded sheet 41, and a discrete resistor 3 positioned over the lifting pin 54 is lifted up together with the expanding sheet 41 by upward motion thereof. The discrete resistor 3 is sucked by a suction tube 57 of a mounting head 56. Then the mounting head 56 is shifted over the circuit board 2 which is set on a transfer device, 55 by its lateral movement as shown by an arrow B. The transfer device 55 is positioned at a predetermined position on the basis of the data of the computer aided designing system, and the discrete resistor 3 sucked on the suction tube 57 is mounted on the circuit board 2 by downward action of the mounting head 56. The above-mentioned process is repeated so that all the discrete resistors 3 on the expanding sheet 41 are mounted on the circuit board 2, and an electronic circuit board 1 for a first trial is completed (Steps 60 and 61).

Subsequently, the electronic circuit board 1 is operated and tested by a known circuit tester (not shown), and the characteristic thereof is tested (Step 62). In the test process, the characteristic of the electronic circuit board 1 is measured whether a predetermined designed operation characteristic is obtained (Step 63). If the designed operation characteristic is not achieved, a resistance of a relating resistor is connected so as to meet the original technical specification of the circuit design (Step 64). Then data corresponding to the corrected resistance is inputted to the computer aided designing system, and a new circuit data for an electronic circuit board 1 is obtained. The new circuit data is inputted to the pattern writing machine 20 (Step 54), and a new electronic parts integrated plate 10 is made (Step 55, 56, 57 and 58). Furthermore, the electronic parts integrated plate 10 is divided into discrete resistors, and is mounted on the circuit board 2 through steps 59, 60 and 61, and an improved electronic circuit board is obtained. The electronic circuit board is tested (Steps 62 and 63). The above-mentioned process for fabrication and measurement of the electronic circuit board 1 are repeated until a desired operation characteristic is obtained. When a suitable operating characteristic of the electronic circuit board 1 is completed (step 65), the circuit data are usable for mass-production of the electronic circuit board 1 (Steps 66, 67, 68, 69, 70, 71 and 72).

Figure 8:
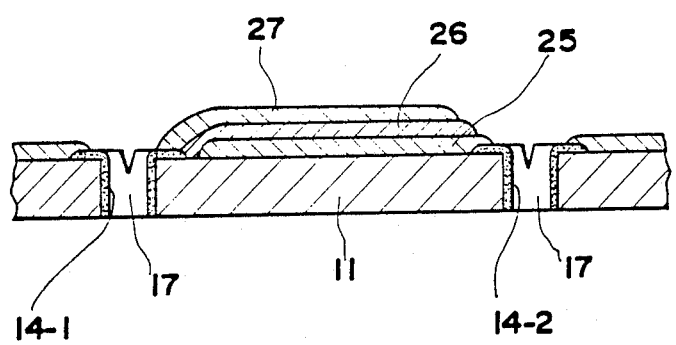
FIG. 8 is a side sectional view showing an example of a capacitor formed on the electronic parts integrated plate.

In the above-mentioned embodiment of method for fabricating electronic circuit board, fabrication of the resistors is shown, but the process is possible to applicable for fabrication of an electronic circuit board including capacitors. An example of method for fabricating the capacitors is shown in FIG. 8. Referring to FIG. 8, a first conductive layer 25 is formed on the substrate 11 in a manner to connect with a lead layer 14-2 at one end. Dielectric substance 26 is coated on the conductive layer 25. Then a second conductive layer 27 is formed on the dielectric substance 26 in a manner to connect with a lead layer 14-1 at one end. As a result, a capacitor is formed wherein two electrodes are connected to lead layers 14-1 and 14-2, respectively.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A method for fabricating electronic circuit board comprising the steps of:
   storing circuit data including electric constant values of electronic parts and special arrangement of the electronic parts in an electronic circuit board in a memory, in accordance with a predetermined circuit design,
   making an electronic parts integrated plate having a plurality of said electronic parts arranged in a predetermined order in accordance with said stored circuit data in the memory by coating a resistivity paste on a substrate and by trimming the electronic parts formed on said substrate, dividing said electronic parts integrated plate into discrete electronic parts, and mounting said discrete electronic parts on an electronic circuit board on the basis of said stored circuit data.

2. A method for fabricating electronic circuit board in accordance with claim 1, wherein said step for dividing said electronic parts integrated plate comprises a step that said electronic parts integrated plate is previously affixed on an expanding sheet.

3. A method for fabricating electronic circuit board comprising the steps of:

storing circuit data including electric constant values of electric parts and special arrangement of the electronic parts in an electronic circuit board in a memory, in accordance with a predetermined circuit design, making an electronic parts integrated plate having a plurality of said electronic parts arranged in a predetermined order in accordance with said stored circuit data by coating a resistivity paste on a substrate by a pattern writing machine and by trimming the electronic parts formed on said substrate, measuring said electric constant value of said electronic parts made on said substrate and issuing measurement data, correcting the operation of said pattern writing machine on the basis of said measurement data, dividing said electronic parts integrated plate into discrete electronic parts, mounting said discrete electronic parts on an electronic circuit board on the basis of said circuit data, testing operating characteristics of said electronic circuit board and issuing test data thereof, and correcting said circuit data on the basis of said test data.

4. A method for fabricating electronic circuit board in accordance with claim 3, wherein said step for dividing said electronic parts integrated plate comprises a step wherein said electronic parts integrated plate is previously affixed on an expanding sheet.

* * * * *